United States Patent
Kim

(10) Patent No.: US 7,507,619 B2
(45) Date of Patent: Mar. 24, 2009

(54) SEMICONDUCTOR DEVICE AND METHOD FOR MANUFACTURING SEMICONDUCTOR DEVICE

(75) Inventor: Gwang Su Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 108 days.

(21) Appl. No.: 11/528,567

(22) Filed: Sep. 28, 2006

(65) Prior Publication Data

US 2007/0096173 A1    May 3, 2007

(30) Foreign Application Priority Data

Sep. 29, 2005  (KR) .................... 10-2005-0091236

(51) Int. Cl.
*H01L 21/336* (2006.01)
(52) U.S. Cl. ...................... 438/197; 438/585
(58) Field of Classification Search ............. 438/197, 438/585, 791; 257/412
See application file for complete search history.

(56) References Cited

U.S. PATENT DOCUMENTS

| 7,314,814 B2* | 1/2008 | Lee ............................ 438/588 |
| 2006/0084247 A1* | 4/2006 | Liu ............................ 438/510 |
| 2006/0269693 A1* | 11/2006 | Balseanu et al. ............ 427/569 |

* cited by examiner

*Primary Examiner*—Mark Prenty
(74) *Attorney, Agent, or Firm*—Finnegan, Henderson, Farabow, Garrett, & Dunner, L.L.P.

(57) ABSTRACT

Provided are a semiconductor device and a method for manufacturing the semiconductor device. The semiconductor device includes: a gate electrode formed of polysilicon on a substrate with a gate insulating layer interposed between the gate electrode and the substrate; a source region and a drain region formed on the substrate on either side of the gate electrode; a PMD (poly-metal dielectric) liner nitride layer having a non-stoichiometric structure formed on the gate electrode, the source region, and the drain region; and an interlayer insulating layer formed on the PMD liner nitride layer.

9 Claims, 6 Drawing Sheets

SEMICONDUCTOR DEVICE AND METHOD FOR MANUFACTURING SEMICONDUCTOR DEVICE

RELATED APPLICATION

This application is based upon and claims the benefit of priority to Korean Application No. 10-2005-0091236, filed on Sep. 29, 2005, the entire contents of which are incorporated herein by reference.

BACKGROUND

1. Technical Field

The present invention relates to a semiconductor device and a method for manufacturing the semiconductor device.

2. Description of the Related Art

A poly-metal dielectric (PMD) layer is generally used for insulating metal interconnections of a semiconductor device from each other, wherein borophosphosilicate glass (BPSG), borosilicate glass (BSG), or phosphosilicate glass (PSG) is used as the PMD.

In order to prevent boron (B) or phosphorus (P) in the PMD layer from diffusing into a gate electrode, a PMD liner layer is interposed between the gate electrode and the PMD layer. The PMD liner layer is formed of tetraethylorthosilicate (TEOS).

In general, the gate electrode is formed of polysilicon having a resistance of several to several tens of ohms ($\Omega$), but recently a polysilicon having a resistance of several megaohms (M$\Omega$) has been manufactured to secure specific characteristics of the gate electrode.

However, since the resistance of the gate electrode is greatly affected by various process factors such as the dose of ion implantation, it is difficult to manufacture the gate electrode having a resistance of several megaohms.

SUMMARY

Accordingly, embodiments consistent with the present invention are directed to a semiconductor device and a method for manufacturing semiconductor device that substantially obviates one or more problems due to limitations and disadvantages of the related art.

An embodiment consistent with the present invention provides a semiconductor device including a gate electrode having a resistance of several megaohms (M$\Omega$), and a method for manufacturing the semiconductor device.

Additional advantages and features of the invention will be set forth in part in the description which follows and in part will become apparent to those having ordinary skill in the art upon examination of the following or may be learned from practice of the invention. Other advantages and features of the invention may be realized and attained by the structure particularly pointed out in the written description and claims hereof as well as the appended drawings.

Consistent with the invention, as embodied and broadly described herein, there is provided a semiconductor device including: a gate electrode formed of polysilicon on a substrate with a gate insulating layer interposed between the gate electrode and the substrate; a source region and a drain region formed on the substrate on either side of the gate electrode; a PMD (poly-metal dielectric) liner nitride layer of non-stoichiometric structure formed on the gate electrode, the source region, and the drain region; and an interlayer insulating layer formed on the PMD liner nitride layer.

In another embodiment consistent with the present invention, there is provided a method for manufacturing a semiconductor device, the method including: forming a gate electrode of polysilicon on a substrate with a gate insulating layer interposed between the gate electrode and the substrate; forming a source region and a drain region on the substrate on either side of the gate electrode; forming a PMD liner nitride layer of non-stoichiometric structure, on the gate electrode, the source region and the drain region; and forming an interlayer insulating layer on the PMD liner nitride layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the present invention and are incorporated in and constitute a part of this application, illustrate embodiment(s) consistent with the present invention and together with the description serve to explain the principle of the present invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
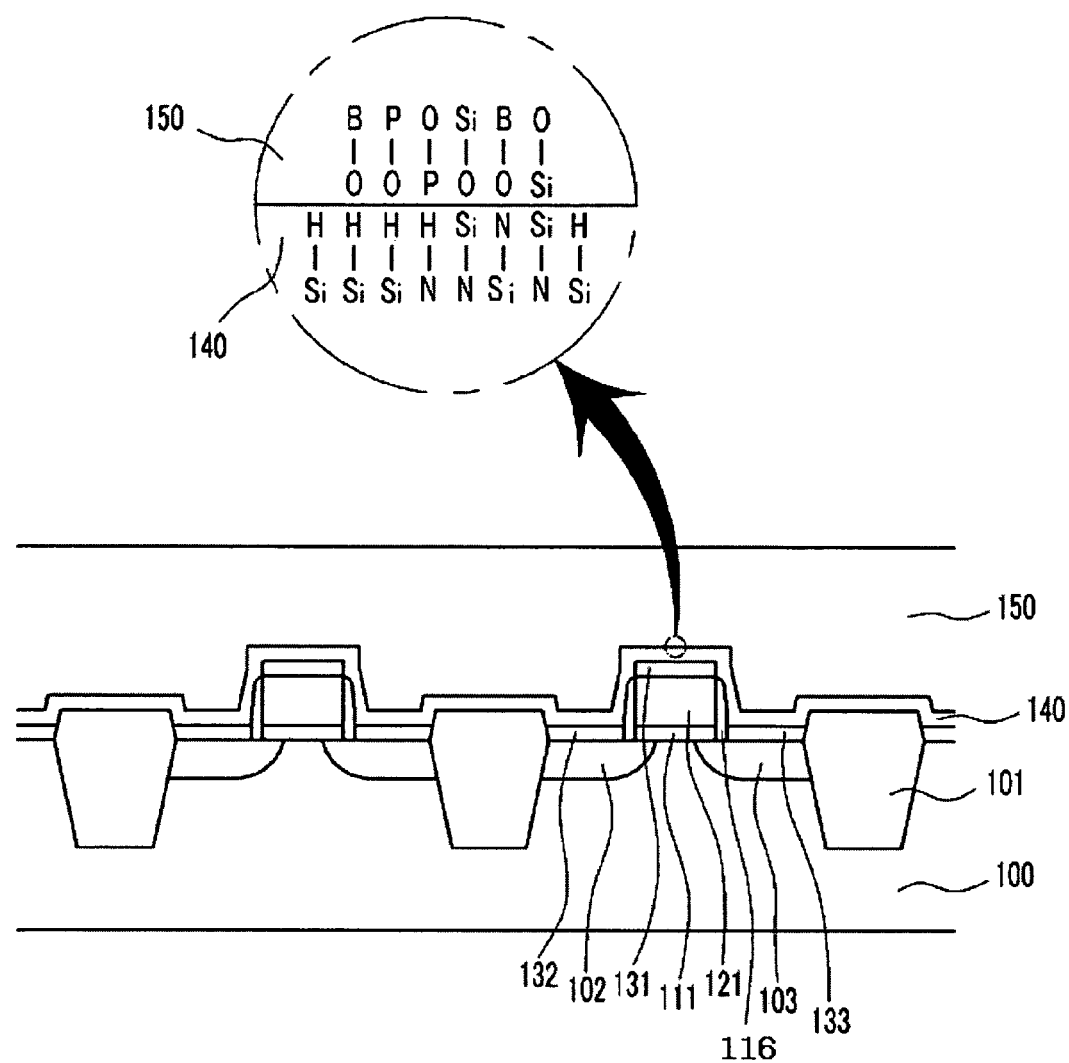
FIG. 1 is a cross-sectional view of a semiconductor device consistent with an embodiment of the present invention.

FIG. 1 is a cross-sectional view of a semiconductor device consistent with an embodiment of the present invention.

Referring to FIG. 1, in the semiconductor device consistent with an embodiment of the present invention, a device isolation layer 101 is formed on a semiconductor substrate 100, which may be, consistent with an embodiment of the present invention, a silicon substrate, and a metal oxide semiconductor field effect transistor (MOSFET) is formed on semiconductor substrate 100 where device isolation layer 101 is formed. Subsequently, a gate insulating layer 111 is formed on semiconductor substrate 100. A gate electrode 121 is then formed on gate insulating layer 111, and sidewall spacers 116 are formed on portions of the sidewalls of gate electrode 121 and gate insulating layer 111. Source region 102 and drain region 103 may be formed in semiconductor substrate 100 using suitable techniques.

Silicide layers 131, 132, and 133 are formed on the gate electrode 121, source region 102, and drain region 103, respectively, to reduce contact resistance.

A poly-metal dielectric (PMD) liner layer 140 is formed on the entire surface of semiconductor substrate 100 where the transistor is formed. In an embodiment consistent with the present invention, PMD liner layer 140 may be a silicon nitride layer having a non-stoichiometric structure. For example, PMD liner layer 140 may have a structure of SiN or $Si_xN_yH_x$.

In addition, PMD liner layer 140 contains about 3 to 35 atomic percent hydrogen dangling bonds. A dangling bond may occur when an atom is missing an adjacent atom to which it would be able to bind. PMD liner layer 140 contains Si—H dangling bonds and N—H dangling bonds to control the resistance of gate electrode 121.

For example, PMD liner layer 140 may contain about 5 to 35 atomic percent hydrogen dangling bonds such as dangling from a silicon atom, Si—H (Si—H, Si—$H_2$, Si—$H_3$), or N—H (N—H, N—$H_2$)

In the semiconductor device consistent with an embodiment of the present invention, the atomic percent of the Si—H dangling bonds is higher than that of the Ni—H dangling bonds, which enables the resistance of gate electrode 121 to be increased. This is because the bonding force is weaker in the Si—H dangling bond than in the N—H dangling bond. Therefore, when the Si—H dangling bond is broken, boron ions ($B^+$) penetrate into gate electrode 121 which increases the resistance is increased, thereby making it possible to form gate electrode 121 having a resistance of several megaohms.

In addition, the boron ions diffuse into gate electrode 121 and couple with the electrons of gate electrode 121 so that the resistance of gate electrode 121 is increased.

An interlayer insulating layer 150 is then formed on PMD liner layer 140.

Interlayer insulating layer 150 is an insulating layer which may contain boron. For example, interlayer insulating layer 150 may be borophosphosilicate glass (BPSG) or borosilicate glass (BSG). Because the boron ions ($B^+$) contained in interlayer insulating layer 150 penetrate into gate electrode 121 through PMD liner layer 140, gate electrode 121 has a resistance of about several megaohms.

Figure 2:
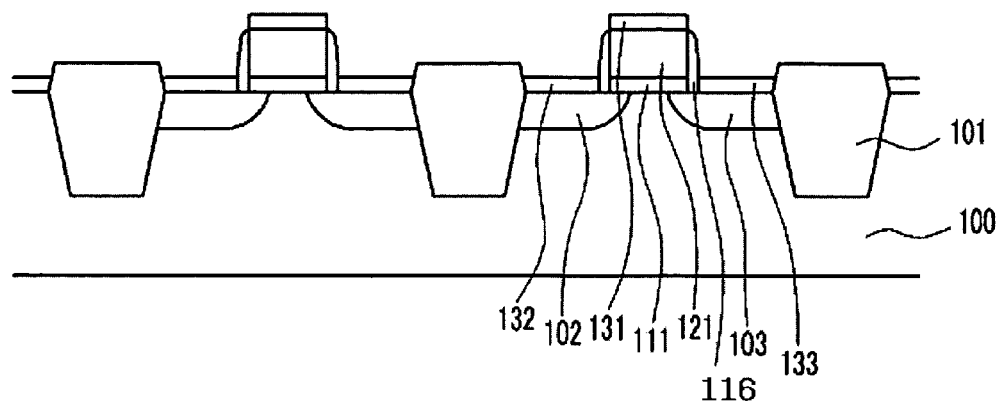
FIGS. 2 to 4 are cross-sectional views illustrating a method for manufacturing a semiconductor device consistent with an embodiment of the present invention.
Figure 3:
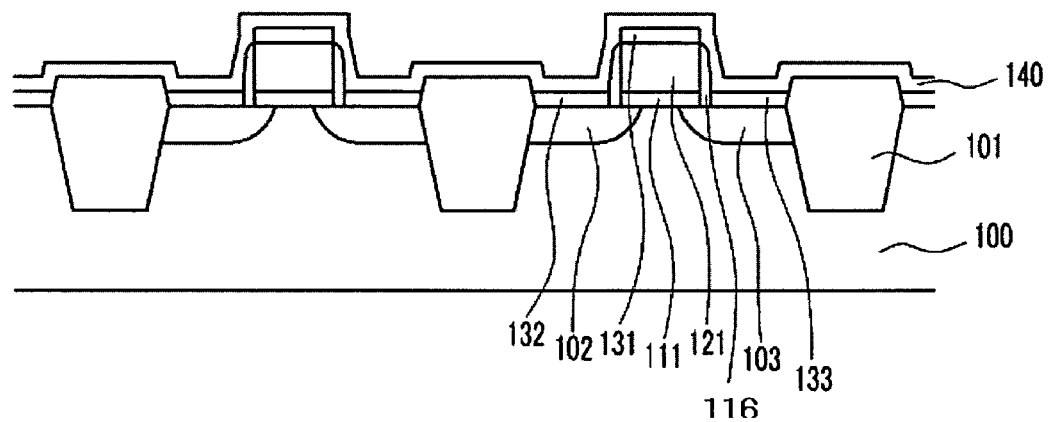
Figure 4:
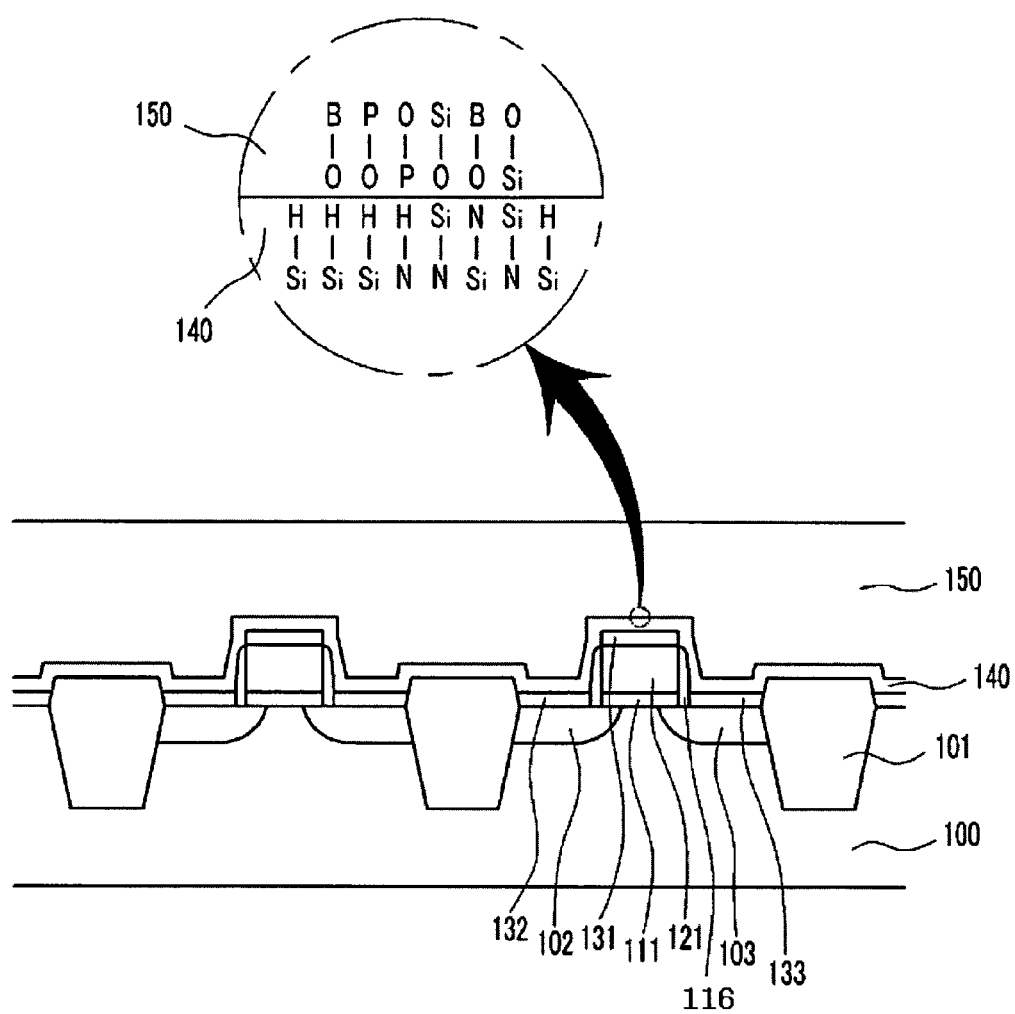

FIGS. 2 to 4 are cross-sectional views illustrating a method for manufacturing a semiconductor device consistent with an embodiment of the present invention.

Referring to FIG. 2, device isolation layer 101 is formed on semiconductor substrate 100, which may be a silicon substrate. Device isolation layer 101 may be formed by a shallow trench isolation (STI) process or a local oxidation of silicon (LOCOS) isolation process.

Afterwards, a transistor, i.e., a MOSFET, is formed on semiconductor substrate 100 in a region between adjacent device isolation layers 101.

In the transistor, gate electrode 121 is formed on semiconductor substrate 100 with gate insulating layer 111 interposed between gate electrode 121 and semiconductor substrate 100. Sidewall spacer 116 is formed on a sidewall of gate electrode 121, and source and drain regions 102 and 103 are then formed by ion implantation process using gate electrode 121 as an ion-implantation mask.

Silicide layers 131, 132, and 133 are formed on gate electrode 121, the source region 102, and the drain region 103, respectively, to reduce contact resistance.

Referring to FIG. 3, PMD liner layer 140 is subsequently formed on the entire surface of semiconductor substrate 100. Here, PMD liner layer 140 may be formed of silicon nitride having a non-stoichiometric structure such as SiN or $Si_xN_yH_x$.

Consistent with an embodiment of the present invention, PMD liner layer 140 may be formed by plasma enhanced chemical vapor deposition (PECVD) process. Moreover, PMD liner layer 140 may be formed using a gas containing $SiH_4$ and $NH_3$. The resistance of gate electrode 121 is controlled by the content of the gas containing $SiH_4$ and $NH_3$.

PMD liner layer 140 contains about 5 to 35 atomic percent hydrogen dangling bonds. Consistent with an embodiment of the present invention, PMD liner layer 140 contains Si—H dangling bonds and N—H dangling bonds to control the resistance of gate electrode 121.

For example, PMD liner layer 140 may contain about 5 to 35 atomic percent hydrogen dangling bonds such as dangling from a silicon atom, Si—H (Si—H, Si—$H_2$, Si—$H_3$), or N—H (N—H, N—$H_2$)

In a method for manufacturing a semiconductor device consistent with an embodiment of the present invention, the atomic percent of the Si—H dangling bonds is higher than that of the Ni—H dangling bonds, which enables the resistance of gate electrode 121 to be increased. This is because the bonding force is weaker in the Si—H dangling bond than in the N—H dangling bond. Therefore, when the Si—H dangling bond is broken, boron ions ($B^+$) diffuse into gate electrode 121 which increases the resistance, thereby making it possible to form gate electrode 121 having a resistance of several megaohms.

In addition, the boron ions diffuse into gate electrode 121 and couple with the electrons in gate electrode 121 so that the resistance of gate electrode 121 is increased.

Referring to FIG. 4, interlayer insulating layer 150 is then formed on PMD liner layer 140.

Interlayer insulating layer 150 is an insulating layer containing boron. For example, interlayer insulating layer 150 may be BPSG or BSG. Boron ions contained in interlayer insulating layer 150 may diffuse into gate electrode 121 through PMD liner layer 140, which may also increase the resistance of gate electrode 121 to a resistance of about several megaohms.

Hereinafter, a semiconductor device and a method for manufacturing the semiconductor device consistent with an embodiment of the present invention will be described in detail with reference to an experimental example.

EXPERIMENTAL EXAMPLE

Figure 5:
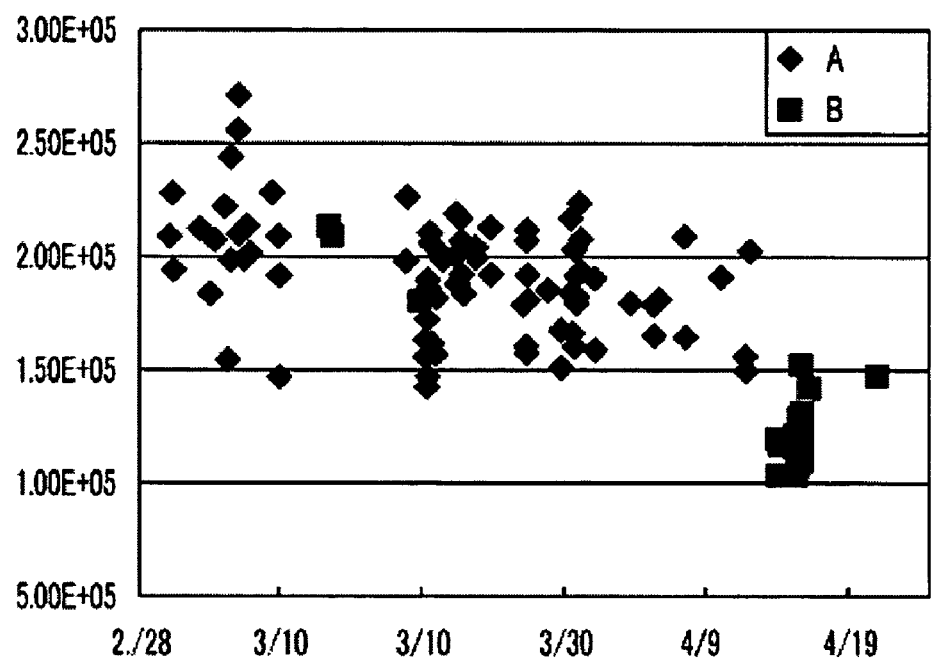
FIG. 5 is a graph illustrating the resistance of a gate electrode for each semiconductor device processed in chambers A and B.

FIG. 5 is a graph illustrating the resistance of a gate electrode for each semiconductor device processed in chambers A and B.

The gate electrode of the semiconductor device processed in chamber A has a resistance of several megaohms, whereas the gate electrode of the semiconductor device processed in chamber B has a relatively low resistance.

As shown in FIG. 5, the resistance of gate electrode 121 of the semiconductor device in which PMD liner layer 140 is deposited in chamber A is higher than that of gate electrode 121 of the semiconductor device in which PMD liner layer 140 is deposited in chamber B.

Figure 6:
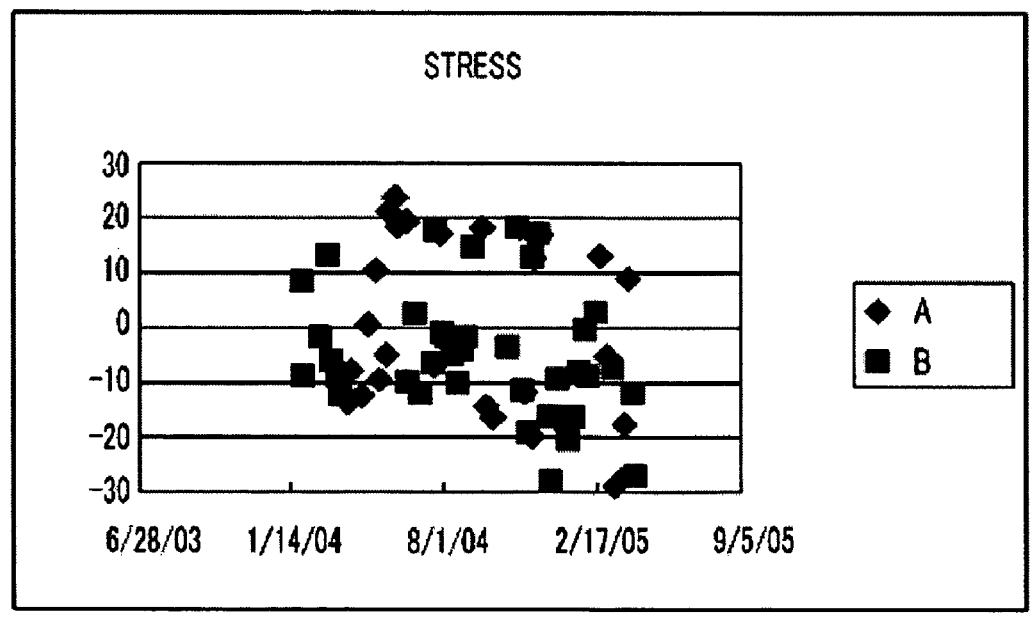
FIG. 6 is a graph illustrating the stress of a poly-metal dielectric (PMD) layer for each semiconductor device processed in chambers A and B.

In addition, as shown in FIG. 6, the stress of PMD liner layer 140 deposited in chamber B is lower than that of PMD liner layer 140 deposited in chamber A.

Figure 7:
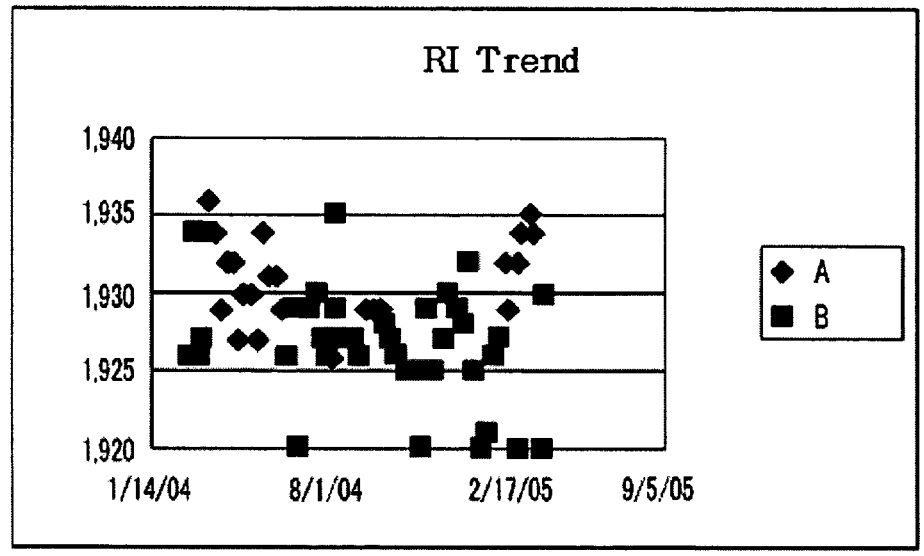
FIG. 7 is a graph illustrating the refractive index (RI) of the PMD liner layer for each semiconductor device processed in chambers A and B.

Furthermore, as shown in FIG. 7, the refractive index (RI) of PMD liner layer 140 deposited in chamber B is lower than that of PMD liner layer 140 deposited in chamber A.

Figure 8:
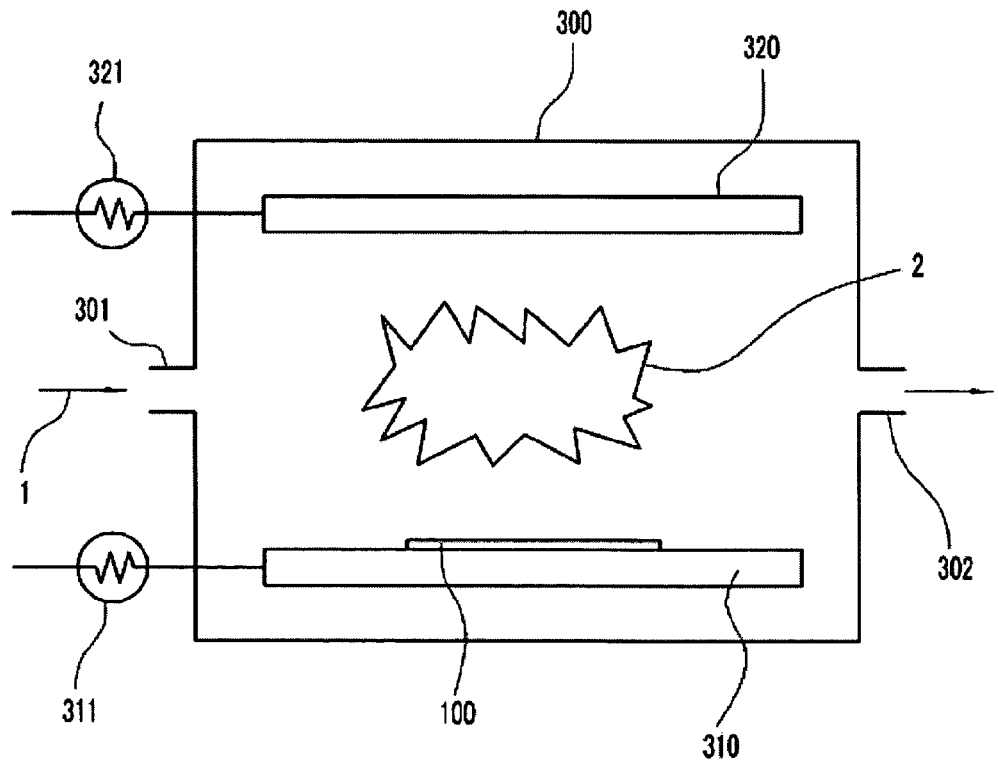
FIG. 8 is a schematic view of a plasma enhanced chemical vapor deposition (PECVD) chamber for forming a PMD liner layer of a semiconductor device consistent with an embodiment of the present invention.

FIG. 8 is a schematic view of a PECVD chamber for forming PMD liner layer 140 of the semiconductor device consistent with an embodiment of the present invention.

Referring to FIG. 8, a high frequency radio frequency (RF) power 321, which may be about 13.56 MHz, and a low frequency RF power 311, which may be about 450 KHz, are simultaneously applied to a PECVD chamber 300 for forming PMD liner layer 140, thereby generating plasma 2. The high frequency RF power 321 applied to an upper electrode 320 acts as dissociation energy for a plasma gas. Low frequency RF power 311 applied to a lower lectrode 310 on which semiconductor substrate 100 is disposed, generates a weak DC voltage difference, which enables some ions in PECVD chamber 300 to penetrate into PMD liner layer 140. Therefore, low frequency RF power 311 applied to lower electrode 310 control the stress of PMD liner layer 140.

Table 1, below, illustrates a stress variation of PMD liner layer 140 according to the variation of low frequency RF power 311 applied to lower electrode 310 of each PECVD chamber 300, and a resistance (Rs) variation of gate electrode 121 according to the stress for each PECVD chamber 300.

TABLE 1

| Wafer | Chamber | Stress (Mpa) | | RI | RS_P1MEG | |
|---|---|---|---|---|---|---|
| | | | | | Avg. | Std. |
| 1 | A | 27.9 | Tensile | 1.933 | 181060.8 | 3401.7 |
| 2 | | 27.9 | Tensile | 1.933 | 177207.2 | 8514.7 |
| 3 | | −29.1 | Compress | 1.933 | 153841.3 | 7164.4 |
| 4 | B | 15.9 | Tensile | 1.926 | 142840.0 | 6904.5 |
| 5 | | −27 | Compress | 1.925 | 138421.2 | 4826.4 |
| 6 | | −27 | Compress | 1.925 | 140165.3 | 5602.8 |

As illustrated in Table 1, the resistance of gate electrode 121 is higher when the stress of PMD liner layer 140 is tensile stress than when the stress is compressive stress. In addition, the resistance variation of a device formed in chamber A may be as high as 300K, whereas the resistance variation of a device formed in chamber B is less than 100K.

The refractive index (RI) of PMD liner layer 140 is determined according to the ratio between $SiH_4$ gas and $NH_3$ gas supplied to PECVD chamber 300 through an inlet 301 when forming PMD liner layer 140. According to the refractive index (RI) of PMD liner layer 140, the resistance of gate electrode 120 is varied. The $SiH_4$ gas, $NH_3$ gas, or gas after reaction may be discharged through an outlet 302.

Table 2 illustrates the resistance variation of gate electrode 121 versus the variation of refractive index (RI). The inflow of $SiH_4$ gas and $NH_3$ gas is changed in order to change the refractive index (RI) of PMD liner layer 140 in chamber B. At this time, the composition ratio between $SiH_4$ gas and $NH_3$ gas of PMD liner layer 140 is also changed.

TABLE 2

| | Chamber A | Chamber B | |
|---|---|---|---|
| | Before | Before | After |
| $SiH_4$ | 282 | 282 | 290 |
| RI | 1.933 | 1.925 | 1.930 |
| Stress | 27.9 tensile | −27 compressive | −3.5 compressive |
| SiH[at %] | 11.39 | 10.34 | 11.84 |
| NH[at %] | 14.4 | 15.01 | 14.2 |
| Rs | 153K | — | 149K |

As illustrated in Table 2, the resistance (Rs) of gate electrode 121 of semiconductor substrate 100 processed in chamber B is increased to the resistance of gate electrode 121 of semiconductor substrate 100 processed in chamber A by increasing the refractive index (RI) of PMD liner layer 140 in chamber B.

The difference between the resistances of gate electrodes 121 in chambers A and B is caused by the difference between the refractive indexes of PMD liner layers 140 deposited on semiconductor substrates 100 processed in the respective chambers A and B. That is, the difference in resistance is caused by the difference in boron transmissivity according to the composition ratio between $SiH_4$ and $NH_3$.

The reason for the resistance difference of gate electrode 121 due to boron transmissivity is illustrated in detail below.

PMD liner layer 140 is formed in PECVD chamber 300 by the following reaction.

$3SiH_4(g) + 4NH_3(g) \rightarrow Si_3N_4(s) + 12H_2(g)$

PMD liner layer 140 generated through the above reaction contains about 5 to 35 atomic percent hydrogen bonded to silicon as Si—H (Si—H, Si—$H_2$, Si—$H_3$) or bonded to nitrogen as N—H (N—H, N—$H_2$).

Although the boron transmissivity is better restrained in PMD liner layer 140 formed of nitride layer than a PMD liner layer formed of TEOS, a predetermined amount of boron is still transmitted because there is a predetermined amount of bonded hydrogen.

As illustrated in FIG. 4, there exists Si—H, N—H, and B—O dangling bonds at the interface between PMD liner layer 140 and the BPSG layer.

Figure 9:
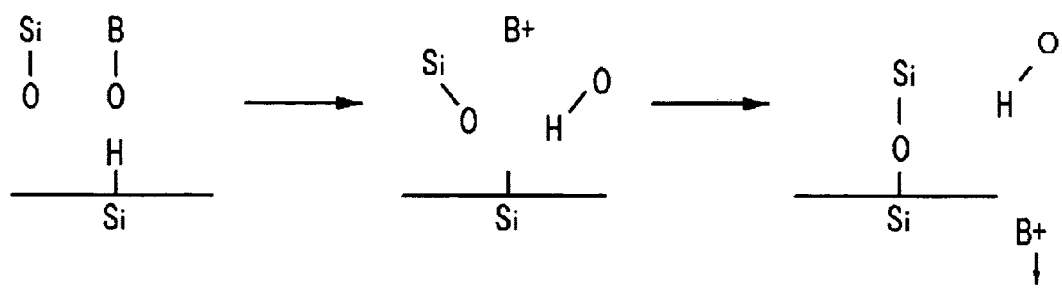
FIG. 9 is a schematic view illustrating how boron (B) penetrates into a gate electrode.

Referring to FIG. 9, the Si—H dangling bond is separated from the surface of PMD liner layer 140, and hydrogen removed from the Si—H dangling bonds are coupled to oxygen from the B—O dangling bonds, so that boron ions ($B^+$) are generated. The boron ions ($B^+$) pass through PMD liner layer 140 and penetrate into gate electrode 121.

The resistance of gate electrode 121 is controlled by electrons generated according to the amount of dopant such as phosphorous ion ($P^+$) or arsenic ion ($As^+$). However, boron, which is a trivalent element, generates a hole. Therefore, when the boron ions penetrate into gate electrode 121, the electrons fill the holes generated by the boron ions so that the resistance of gate electrode 121 increases.

Since the number of the Si—H dangling bonds increases as the Si—H/N—H atomic percent of PMD liner layer 140 increases, the amount of boron ions penetrating into gate electrode 121 becomes correspondingly greater so that the resistance of gate electrode 121 is increased even more.

Therefore, it is concluded that in the examples presented above the resistance of gate electrode 121 is lower in chamber B than chamber A, because the atomic percent of Si—H, i.e., Si—H dangling bond, is lower in chamber B than chamber A.

Since the dopant dose of gate electrode 121 is large in gate electrode 121 having the resistance of several to several tens of ohms, the amount of boron (B) penetrating into gate electrode 121 from the BPSG layer is relatively small.

On the contrary, because the amount of dopant of gate electrode 121 having a resistance of several megaohms is small, the amount of boron (B) penetrating into gate electrode 121 from the BPSG layer is relatively large.

In the semiconductor device consistent with an embodiment of the present invention, the ion implantation process may be performed under conditions in which the dose of phosphorous ion ($P^+$) is in the range of about 2×E12 to 5×E12, and implantation energy is about 40 kev.

Therefore, it is possible to effectively control the resistance of gate electrode 121 by controlling the ratio between the $SiH_4$ and $NH_3$ gases, which determines the content of the Si—H dangling bond and the N—H dangling bond, and minutely controlling the refractive index (RI) of PMD liner layer 140.

The resistance of gate electrode 121 is controlled by the content of $SiH_4$ and $NH_3$ constituting PMD liner layer 140. That is, the resistance of gate electrode 121 is controlled according to the ratio between the Si—H dangling bond and the N—H dangling bond of PMD liner layer 140. When atomic percent of the Si—H dangling bond is higher than that of the N—H dangling bond, the resistance of gate electrode 121 is high.

In the semiconductor device consistent with an embodiment of the present invention, because PMD liner layer 140 is formed such that it has a non-stoichiometric structure, and the PMD liner layer 140 has higher atomic percent Si—H dangling bonds than N—H dangling bonds, gate electrode 121 may have a resistance of several megaohms.

That is, the bonding force is weaker in the Si—H dangling bond than the N—H dangling bond in PMD liner layer 140 so that the Si—H dangling bond is easily broken. Accordingly, the boron ions ($B^+$) of interlayer insulating layer 150 penetrate into gate electrode 121 so that it is possible to form gate electrode 121 with high resistance of several megaohms.

Furthermore, in a method for manufacturing a semiconductor device consistent with an embodiment of the present invention, the resistance of gate electrode 121 can be controlled according to the content of $SiH_4$ and $NH_3$ constituting PMD liner layer 140 so that it is possible to effectively form gate electrode 121 with high resistance of megaohms.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a semiconductor device, the method comprising:

forming a gate electrode of polysilicon on a substrate with a gate insulating layer interposed between the gate electrode and the substrate;

forming a source region and a drain region on the substrate on either side of the gate electrode;

forming a PMD (poly-metal dielectric) liner nitride layer having a non-stoichiometric structure, on the gate electrode, the source region, and the drain region; and forming an interlayer insulating layer on the PMD liner nitride layer, wherein the PMD liner nitride layer includes 5 to 35 atomic percent hydrogen dangling bonds.

2. The method according to claim 1, wherein the interlayer insulating layer includes boron (B).

3. The method according to claim 2, wherein the interlayer insulating layer comprises BPSG (borophosphosilicate glass).

4. The method according to claim 2, wherein the interlayer insulating layer comprises BSG (borosilicate glass).

5. The method according to claim 1, wherein the hydrogen dangling bonds comprise Si—H dangling bonds and N—H dangling bonds, and the hydrogen dangling bonds control the resistance of the gate electrode.

6. The method according to claim 5, wherein the atomic percent of Si—H dangling bond is greater than the atomic percent of N—H dangling bond.

7. The method according to claim 6, wherein hydrogen from the Si—H dangling bonds are separated from the PMD liner nitride layer and couple with oxygen from B—O bonds in the interlayer insulating layer releasing boron ions ($B^+$) which diffuse into the gate electrode increasing the resistance of the gate electrode.

8. The method according to claim 7, wherein the boron ions ($B^+$) bond with electrons in the gate electrode increasing the resistance of the gate electrode.

9. A method for manufacturing a semiconductor device, the method comprising:

forming a gate electrode of polysilicon on a substrate with a gate insulating layer interposed between the gate electrode and the substrate;

forming a source region and a drain region on the substrate on either side of the gate electrode;

forming a PMD (poly-metal dielectric) liner nitride layer having a non-stoichiometric structure, on the gate electrode, the source region, and the drain region; and forming an interlayer insulating layer on the PMD liner nitride layer, wherein the resistance of the gate electrode is controlled according to the content of $SiH_4$ and $NH_3$ used in forming the PMD liner nitride layer.

* * * * *